(12) United States Patent
Ishino et al.

(10) Patent No.: US 9,748,922 B2
(45) Date of Patent: Aug. 29, 2017

(54) TUNING-FORK TYPE CRYSTAL RESONATOR PLATE AND CRYSTAL RESONATOR DEVICE

(71) Applicant: DAISHINKU CORPORATION, Kakogawa-shi, Hyogo (JP)

(72) Inventors: Satoru Ishino, Kakogawa (JP); Yoshinobu Sakamoto, Kakogawa (JP)

(73) Assignee: DAISHINKU CORPORATION, Kakogawa-shi (JP)

( * ) Notice: Subject to any disclaimer, the term of this patent is extended or adjusted under 35 U.S.C. 154(b) by 35 days.

(21) Appl. No.: 14/782,986

(22) PCT Filed: Mar. 12, 2014

(86) PCT No.: PCT/JP2014/056506
§ 371 (c)(1),
(2) Date: Oct. 7, 2015

(87) PCT Pub. No.: WO2014/167933
PCT Pub. Date: Oct. 16, 2014

(65) Prior Publication Data
US 2016/0308510 A1    Oct. 20, 2016

(30) Foreign Application Priority Data

Apr. 11, 2013  (JP) ................. 2013-083066

(51) Int. Cl.
*H03H 9/215*   (2006.01)
*H03H 9/21*    (2006.01)
*H03H 9/10*    (2006.01)
*H03H 9/13*    (2006.01)

(52) U.S. Cl.
CPC ............ *H03H 9/21* (2013.01); *H03H 9/1021* (2013.01); *H03H 9/13* (2013.01); *H03H 9/215* (2013.01)

(58) Field of Classification Search
CPC .................................. H03H 9/215; H03H 9/21
USPC ........................................................ 310/370
See application file for complete search history.

(56) References Cited

U.S. PATENT DOCUMENTS

| 6,927,530 | B2 | 8/2005 | Tanaya et al. |
| 7,535,159 | B2 | 5/2009 | Kizaki |
| 7,550,905 | B2 * | 6/2009 | Tanaya ................. H03H 9/1021 310/321 |
| 7,863,803 | B2 | 1/2011 | Yamada et al. |
| 7,906,890 | B2 * | 3/2011 | Kawanishi ........... H03H 9/1014 310/370 |
| 8,018,127 | B2 | 9/2011 | Kikushima et al. |

(Continued)

FOREIGN PATENT DOCUMENTS

| JP | 2007-013391 A | 1/2007 |
| JP | 4001029 B2 | 10/2007 |
| JP | 2012-217140 A | 11/2012 |

*Primary Examiner* — J. San Martin
(74) *Attorney, Agent, or Firm* — Marvin A. Motsenbocker; American Patent Works

(57) ABSTRACT

A tuning-fork type crystal resonator plate includes a base portion and a pair of leg portions protruding from the base portion in one direction. A groove and a bank portion are formed on at least one of main surfaces of each of the leg portions. The bank portion is formed accompanied by the formation of the groove, and a width of the bank portion differs along a width direction. The bank portion is constituted by a thick portion having a large width and a thin portion having a small width.

12 Claims, 6 Drawing Sheets

(56) References Cited

U.S. PATENT DOCUMENTS

| | | | |
|---|---|---|---|
| 8,446,079 B2* | 5/2013 | Fang | H03H 9/21 |
| | | | 310/370 |
| 9,455,683 B2* | 9/2016 | Kyoung | H03H 9/21 |
| 2004/0085163 A1 | 5/2004 | Kikushima | |
| 2007/0007864 A1 | 1/2007 | Tanaya | |
| 2012/0248938 A1 | 10/2012 | Kawanishi | |

* cited by examiner

TUNING-FORK TYPE CRYSTAL RESONATOR PLATE AND CRYSTAL RESONATOR DEVICE

TECHNICAL FIELD

The present invention relates to a tuning-fork type crystal resonator plate and a crystal resonator device.

BACKGROUND ART

Known tuning-fork type crystal resonator plates include a tuning-fork type crystal resonator plate made up of a base portion and two leg portions protruding from the base portion (see, for example, Patent Document 1). Such a tuning-fork type crystal resonator plate includes a pair of driving electrodes having different potentials formed on the two leg portions. A turning-fork type crystal resonator device is made by hermetically sealing the tuning-fork type crystal resonator plate within an internal space of a main body casing made up of a base and a lid (see, for example, Patent Document 1). The tuning-fork type crystal resonator plate includes grooves formed in the leg portions so that bank portions are formed on the leg portions. The CI value can be reduced by the grooves. When the width of the groove is increased, the width of the bank portion is decreased and electrolytic efficiency is improved, thus the CI value can be further reduced. However, in order to vibrate the leg portion, the minimum width of the bank portion should be ensured. Thus, the widths of the grooves and the bank portions are limited according to the size of the leg portion, which means that the reduction of the CI value by increasing the width of the grooves is also limited. Also, conventionally, a side surface of the leg portion has a pointed protrusion due to crystal anisotropic etching. Such a protrusion causes variation in the distance in the width direction of the leg portion between an electrode on an internal surface of the groove and an electrode on the side surface of the leg portion, which decreasing vibration efficiency.

PRIOR ART DOCUMENT

Patent Document

[Patent Document 1] JP 2012-217140 A

SUMMARY OF INVENTION

Problem to be Solved by Invention

The tuning-fork type crystal resonator plates have been downsized in recent years, which results in difficulty in formation of the driving electrodes on the leg portions having the grooves.

Also, conventionally, the width of the bank portion can be ensured for excellent oscillation. However, according to the reduction in size of the tuning-fork type crystal resonator plate, the width of the bank portion is decreased. As a result, the gap between the pair of driving electrodes is extremely decreased, which leads to an unstable oscillation. In addition, due to rigidity decrease, another oscillation mode may be generated.

In order to resolve the above problems, an object of the present invention is to provide a tuning-fork type crystal resonator plate having leg portions in which grooves are formed and a crystal resonator device, the tuning-fork type crystal resonator plate capable of oscillating stably even when the width of the grooves is increased relative to the width of the leg portions.

Means for Solving Problem

In order to achieve the above object, a tuning-fork type crystal resonator plate according to the present invention is made of a crystal plate having a crystal orientation, and includes a base portion and a pair of leg portions protruding from the base portion in one direction. A groove and a bank portion are formed on at least one of main surfaces of each of the leg portions. The bank portion is formed accompanied by the formation of the groove. A width of the bank portion differs along a thickness direction (of the tuning-fork type crystal resonator plate) and the bank portion is constituted by a thick portion having a large width and a thin portion having a small width.

According to the present invention, the tuning-fork type crystal resonator plate having the leg portions in which the grooves are formed can oscillate stably even when the width of the grooves is increased relative to the width of the respective leg portions. Specifically, since the bank portion is constituted by the thin portion and the thick portion, it is possible to substantially increase the width of the bank portion. Thus, a stable oscillation can be obtained by suppressing the generation of the other vibration modes (generation of spurious). With the conventional tuning-fork type crystal resonator plate, it is possible to decrease the CI value by increasing the width of the grooves, while the planar shape of the side surfaces of the leg portion leads to the width of the bank portions being generally decreased. Thus, the rigidity is decreased. For this reason, in the conventional tuning-fork type crystal resonator plate, it is difficult to ensure the width of the bank portions necessary for the vibration while decreasing the CI value by increasing the width of the grooves. However, in the present invention having the above-described configuration, it is possible to decrease the CI value by increasing the width of the grooves while ensuring the width of the bank portions necessary for the vibration.

Also, in the present invention, the bank portion is constituted by the thick portion and the thin portion. Due to the thick portion, it is possible to reduce the size of the tuning-fork type crystal resonator plate while increasing the rigidity. In the result, it is possible to obtain a stable oscillation and suppress the increase of the oscillatory frequency. Furthermore, due to the thin portion, it is possible to reduce the size of the tuning-fork type crystal resonator plate while decreasing the CI value. Thus, by constituting the bank portion by the thick portion and the thin portion, it is possible to maintain the rigidity by the thick portion while increasing the width of the groove relative to the width of the leg portion. Accordingly, it is possible to realize the miniaturized tuning-fork type crystal resonator plate in which the CI value is decreased while suppressing the oscillatory frequency.

In the above-described configuration, the groove may be formed so as to be deviated relative to a center of the leg portion in a width direction, and widths from a lowermost point of the groove to respective side surfaces of the leg portion in cross-sectional view in the width direction may be the same.

In this case, although the groove is formed so as to be deviated relative to the center of the leg portion in the width direction, the respective widths from the lowermost point of the groove to both side surfaces of the leg portion are the same. Thus, due to the thick portion, the weights of the left and right sides of the groove in cross-sectional view in the width direction are well balanced. Accordingly, the vibration can be stabilized.

Here, the "deviated" state is satisfied when the groove is formed so as to be deviated relative to the center of the leg portion in the width direction, and when the distances from the groove (the internal surface of the groove) to the respective side surfaces of the leg portion (i.e., the sizes of the banks formed on the main surface of the leg portion) are not the same.

In the tuning-fork type crystal resonator plate made of a crystal plate, in the internal surface of each of the grooves formed on the respective main surfaces of the leg portion, not all side surfaces can be formed so as to be perpendicular to the corresponding main surface. However, such a configuration can also be effective to maintain the weight balance of each of the leg portions by forming each groove so as to be deviated relative to the center of the corresponding leg portion in the width direction. For example, in the configuration in which the sizes of the multiple surfaces constituting the groove are different from one another, the lowermost point is not likely to be positioned in the center of the leg portion, accordingly, the leg portion are badly balanced in weight. Thus, the groove is formed so as to be deviated relative to the center of the leg portion in the width direction to improve the weight balance. That is, in the leg portion, the difference between the left and right cross-sectional areas in cross-sectional view in the width direction can be reduced, which results in improvement of the weight balance.

However, only forming the groove so as to be deviated relative to the center of the leg portion in the width direction cannot be the optimal means to maintain the weight balance of each of the leg portions. That is, even if the groove is formed so as to be maximally deviated relative to the center of the leg portion in the width direction, the weight of the leg portion cannot be uniformed to the extent that the weight balance is maintained. This relates specifically to the current tendency of the tuning-fork type crystal resonator plate to be miniaturized. The conventional large-size tuning-fork type crystal resonator plate can maintain the balance without consideration of the weight balance. However, in the miniaturized tuning-fork type crystal resonator plate, the leg portions are also miniaturized and narrowed, and the weight balance is lost when the grooves are formed in the miniaturized/narrowed leg portions. Thus, the problem that was unthinkable with respect to the conventional tuning-fork type crystal resonator plate is accompanied by the miniaturization.

In contrast, the present invention has characteristics that the groove is formed so as to be deviated relative to the center of the leg portion in the width direction, and that the widths from the lowermost point of the groove to the respective side surfaces of the leg portion are the same in cross-sectional view in the width direction. Thus, further weight correction can be performed to the configuration using a crystal plate, in which the grooves are formed so as to be deviated relative to the respective centers of the leg portions in the width direction, so that the weight balance can be maintained. This relates to the fact that the crystal plate is used for the tuning-fork type crystal resonator plate. The side surfaces composed of the multiple surfaces of the groove include inclined surfaces. The inclined surfaces of the side surfaces (the multiple surfaces) have different areas. Therefore, by forming the grooves, the leg portions lose the weight balance. However, in the present invention, the widths from the lowermost point of the groove to respective side surfaces of the leg portion are the same in cross-sectional view in the width direction. Thus, it is possible to prevent the leg portion from losing the balance in weight.

In the result, it is possible to maintain the weight balance and to prevent the characteristics (e.g., the CI value) from being affected by the shape of the grooves formed in the leg portions.

Specifically, in the present invention using the crystal plate, the grooves are formed in the leg portions so as to be deviated relative to the respective centers of the leg portions in the width direction, and the widths from the lowermost point of the groove to the respective side surfaces of the leg portion are the same in cross-sectional view in the width direction. Thus, it is possible to prevent the leg portions from losing the balance in weight.

In the above-described configuration, the position of the groove is deviated relative to the center of the leg portion in the width direction, so that the left and right weight balance of the leg portion in the width direction can be maintained. Furthermore, since the widths from the lowermost point of the groove to the respective side surfaces of the leg portion are the same in cross-sectional view in the width direction, it is possible to reduce the differences in the areas of the inclined surfaces of the side surfaces (the multiple surfaces). In the result, a good weight balance is maintained.

On the other hand, in the conventional tuning-fork type crystal resonator plate, the areas of the left and right inclined surfaces in the leg portion considerably differ from each other, thus, the thicknesses of the left and right sides of the leg portion having the groove therebetween differ from each other. This results in the vibrations having different frequencies of the left and right sides of the leg portion, which deteriorating the weight balance.

Also, in a case in which the groove has a bottom surface differently from the present invention, the position of the lowermost point cannot be determined, which deteriorates the weight balance. In the present invention, such a problem does not occur. In the present invention, the groove has no bottom surface, but has only the lowermost point.

Furthermore, in the conventional tuning-fork type crystal resonator plate that has the grooves in the respective leg portions, not only the main vibration for the excitation but also other vibration modes (longitudinal vibration mode and the like) are generated. This relates to the fact that, in the conventional configuration, the lowermost point or the bottom surface of the groove is formed so as to be significantly deviated relative to the center of the leg portion in the width direction, and that the internal surface (the side surfaces) of the groove is a surface inclined relative to the main surface.

In contrast, in the present invention, the grooves are formed in the leg portions so as to be deviated relative to the respective centers of the leg portions in the width direction, and the widths from the lowermost point of the groove to the respective side surfaces of the leg portion are the same in cross-sectional view in the width direction. Thus, in cross-sectional view in the width direction, the shapes of the side surfaces out of the internal surface of the groove are symmetrical or are substantially symmetrical. Also, compared with the conventional tuning-fork type crystal resonator plate, one or more inclined surfaces out of the internal surface of the groove can be decreased. That is, by decreasing one or more surfaces out of the internal surface of the groove, the component ratio (areas) of the other inclined surfaces can be varied, and furthermore, the lowermost point of the groove can be positioned in the middle of the leg portion.

In the result, it is possible to suppress generation of the other vibration modes (longitudinal vibration mode and the like) that would be caused by the decreased inclined surfaces. Thus, it is possible to prevent the characteristics of the tuning-fork type crystal resonator plate from degrading, specifically, it is possible to decrease the CI value, or to suppress the increase of the CI value.

These days, there is a tendency of miniaturization of the size of the package for the crystal resonator device, such as the crystal resonator and an oscillator, on which the tuning-fork type crystal resonator plate is mounted (e.g., the package size: not more than 2.0 mm×1.2 mm, and the overall length of the tuning-fork type crystal resonator plate, which is the length in the longitudinal direction corresponding to the protruding direction of the leg portion: not more than 1.5 mm). The inventor has confirmed that, according to the miniaturization, spurious is easily generated in the vibration of the tuning-fork type crystal resonator plate. On the other hand, conventionally, the spurious has hardly been generated in the tuning-fork type crystal resonator plate, and there has been no need to consider spurious suppression. However, in the actual miniaturized tuning-fork type crystal resonator plate, it is necessary to consider the spurious suppression. With regard to the spurious occurrence, it is possible to suppress the spurious in the present invention, by decreasing the inclined surfaces of the side surfaces of the groove, and reducing the differences in the angles of inclination among the inclined surfaces. Thus, due to the spurious suppression, the CI value can be reduced. The present invention is optimal for the miniaturized tuning-fork type crystal resonator plate. Furthermore, it is possible to prevent the value of oscillation frequency (the value of the main vibration) from being changed due to the spurious occurrence.

In the above-described configuration, the thick portion may have a trapezoidal shape in cross-sectional view in the width direction, and the thick portion may be located in the width direction where the lowermost point of the groove is positioned.

The cross section of the thick portion has the trapezoidal shape, and the thick portion is located in the width direction where the lowermost point of the groove is positioned. Thus, it is possible to face the driving electrode formed in the groove and the driving electrode disposed on both side surfaces via the bank portion. In the result, the vibration efficiency can be improved and the CI value can be decreased.

In the above-described configuration, a top surface of the trapezoid of the thick portion may face the surface of the groove.

In this case, since the top surface of the trapezoid of the thick portion is disposed so as to face the surface of the groove, it is possible to form parallel electrodes. Thus, it is possible to obtain perfect charge efficiency. In particular, due to the thick portion having the trapezoidal shape, part of the bank portion can have the fixed thickness relative to the bending direction. Thus, it is possible to suppress the generation of the other vibration modes (longitudinal vibration mode and the like) and decrease the CI value.

In the above-described configuration, in the main surfaces of the leg portion, the respective grooves may be formed in a first main surface and a second main surface, and the lowermost point of the groove in the first main surface and the lowermost point of the groove in the second main surface may be opposed to each other in cross-sectional view in the protruding direction.

In this case, the respective lowermost points of the groove in the first main surface and of the groove in the second main surface are opposed to each other in cross-sectional view in the protruding direction. Thus, it is possible to prevent the weight balance from being deteriorated in the thickness direction of each leg portion. In the result, it is possible to suppress the generation of other vibration modes (longitudinal vibration mode and the like) due to deterioration of the weight balance. Thus, it is possible to prevent the characteristics of the tuning-fork type crystal resonator plate from degrading, specifically, it is possible to decrease the CI value, or to suppress the increase of the CI value. That is, the low CI value can be realized.

In order to achieve the above object, the crystal resonator device according to the present invention includes the tuning-fork type crystal resonator plate according to the present invention.

Since the crystal resonator device includes the tuning-fork type crystal resonator plate according to the present invention, it has a function and effect similar to those of the above-described tuning-fork type crystal resonator plate according to the present invention.

Effects of Invention

In the present invention, the tuning-fork type crystal resonator plate including the leg portions having the grooves can stably oscillate even when the width of the bank portions is decreased. Therefore, the present invention is suitable, in particular, for a miniaturized tuning-fork type crystal resonator plate.

BRIEF DESCRIPTION OF DRAWINGS

FIG. 1 is a schematic plan view showing the crystal resonator plate.

MODES FOR CARRYING OUT INVENTION

Hereinafter, an embodiment of the present invention will be described with reference to the drawings. In the embodiment described here, a crystal is used as a material for a blank of a piezoelectric resonator plate, and further a tuning-fork type crystal resonator is used for a crystal resonator device. However, this is merely a preferable embodiment. The present invention is not limited to the tuning-fork type crystal resonator. The present invention may be applied to any tuning-fork type crystal resonator device including a tuning-fork type crystal resonator plate, for example, a crystal oscillator.

Figure 1:
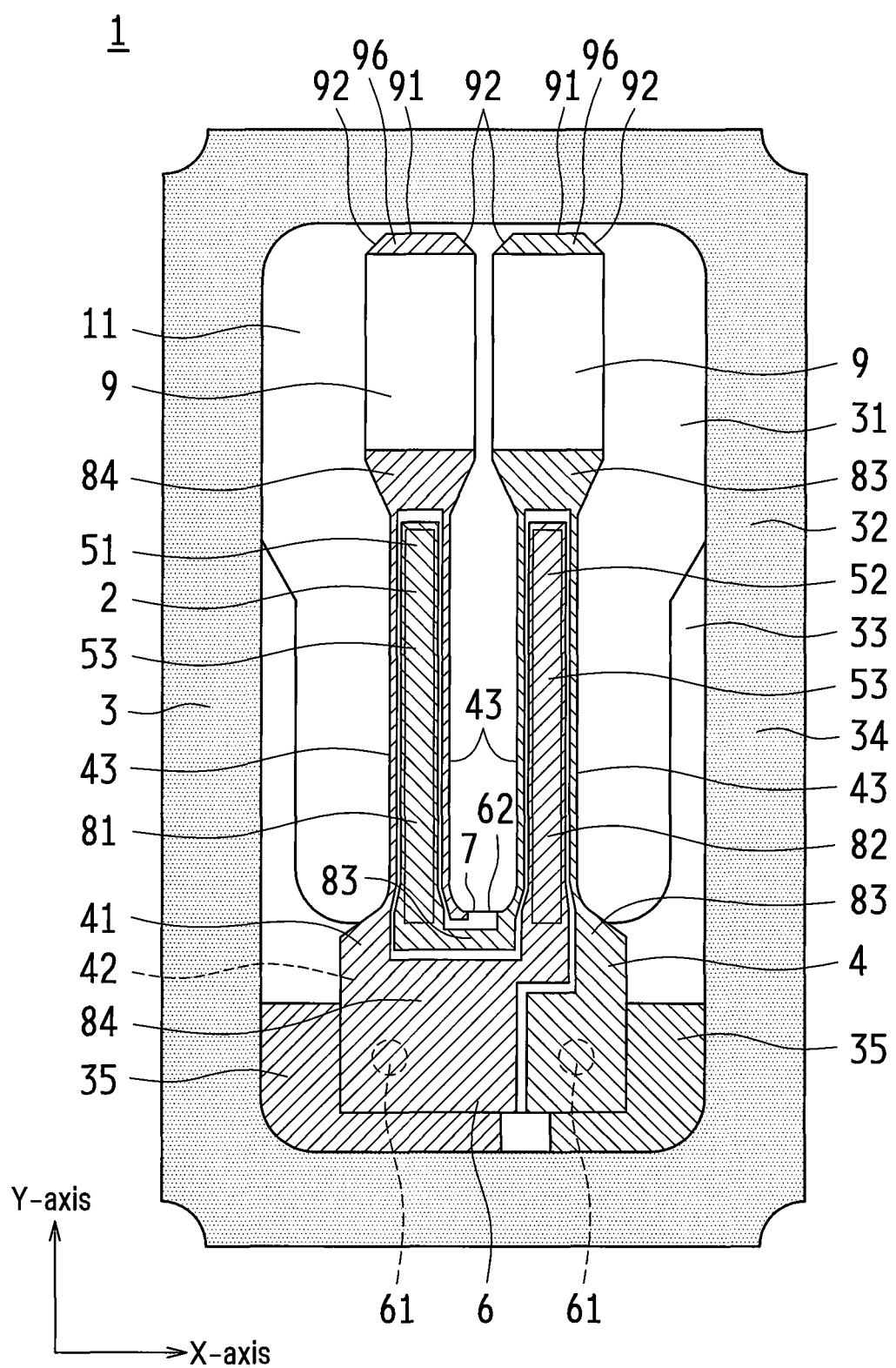
FIG. 1 is a diagram showing an inside of a crystal resonator according to an embodiment of the present invention, more specifically, a schematic plan view of a base on which a crystal resonator plate is mounted. Also.
Figure 2:
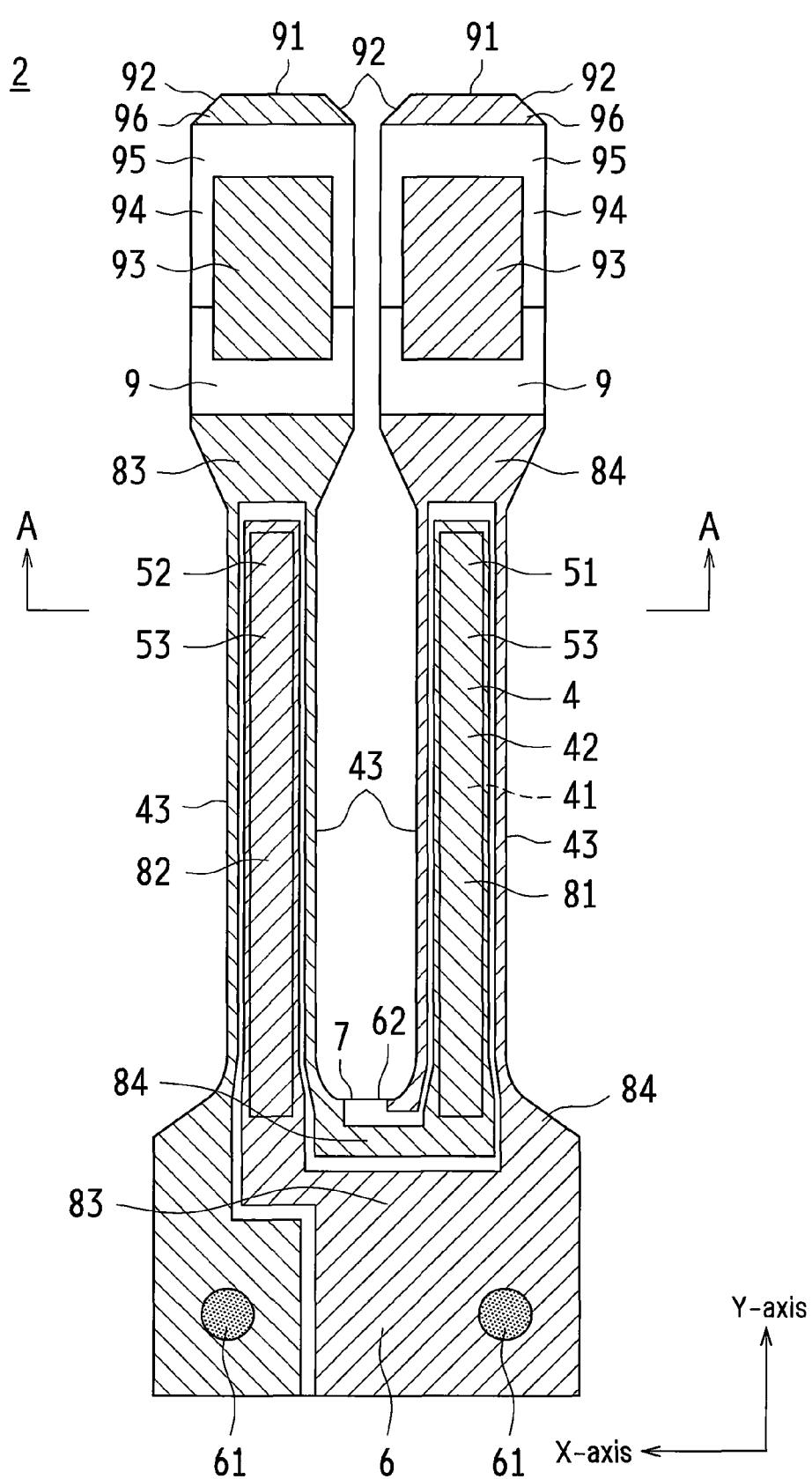
FIG. 2 is a schematic rear view of the crystal resonator plate shown in FIG. 1.

As shown in FIGS. 1 and 2, a tuning-fork type crystal resonator 1 (hereinafter referred to as a crystal resonator)

according to this embodiment includes: a tuning-fork type crystal resonator plate 2 (hereinafter referred to as a crystal resonator plate) shaped by a photolithography method; a base 3 on which the crystal resonator plate 2 is mounted; and a lid (not shown) to hermetically seal the crystal resonator plate 2 mounted on (held by) the base 3 within a main body casing.

In the crystal resonator 1, the main body casing is formed by bonding the base 3 and the lid. Specifically, the base 3 is bonded to the lid via a sealant (not shown), whereby an internal space 11 is formed in the main body casing. The crystal resonator plate 2 is bonded on and held by the base 3 within the inner space 11 of the main body casing via conductive bumps 61, and the internal space 11 of the main body casing is hermetically sealed. In this case, the crystal resonator plate 2 is disposed on the base 3 so that metal films 93 (described later), tip portion metal films 96 (described later) and recess portions 95 (described later) of the crystal resonator plate 2 face the base 3. The crystal resonator plate 2 is electrically and mechanically bonded to the base 3 by the ultrasonic FCB (flip chip bonding) method using the conductive bumps 61 made of a metal material (e.g., gold) and the like.

Next, each component of the crystal resonator 1 will be described.

As shown in FIG. 1, the base 3 is formed as a box-like body made up of a bottom portion 31 and a dike portion 32 that extends upward from the bottom portion 31. The dike portion 32 is made of two laminated layers, and a step portion 33 is provided in the internal space 11. The base 3 is made by: placing a rectangular parallelepiped made of a ceramic material on a rectangular-shaped single plate in plan view made of a ceramic material; and baking them into a single unit having a concave shape. The dike portion 32 is shaped along a periphery of the bottom portion 31 in plan view, as shown in FIG. 1. On a top surface of the dike portion 32, a metallization layer 34 (part of sealant) is provided so as to be bonded to the lid. The metallization layer 34 is made by plating, for example, a tungsten layer or molybdenum layer with nickel and gold in this order.

In the base 3 obtained by baking the laminated ceramic materials into the single unit having the concave shape, the step portion 33 is formed at one end portion in the longitudinal direction of the internal space 11 and at parts of end portions along the longitudinal direction of the internal space 11. At one end portion of the step portion 33 in the longitudinal direction, a pair of electrode pads 35 is formed as shown in FIG. 1. The crystal resonator plate 2 is mounted on and held by the electrode pads 35 via the conductive bumps 61 formed on the crystal resonator plate 2. The electrode pads 35 are electrically connected to terminal electrodes (not shown) formed on the rear surface of the base 3 via respectively corresponding routing electrodes (not shown). The terminal electrodes are connected to external electrodes of an external component or an external device. The electrode pads 35, the routing electrodes and the terminal electrodes are formed by being integrally baked with the base 3 after printing a metallization material such as tungsten, molybdenum or the like. On some of the electrode pads 35, the routing electrodes and the terminal electrodes, nickel is plated on the metallization, and gold is plated on the nickel plating.

The lid is made of, for example, a metal material, and is shaped into a single rectangular plate in plan view. On the undersurface of the lid, part of the sealant is formed. The lid is bonded to the base 3 via the sealant by a method such as seam welding, beam welding, hot-melt bonding or the like. Thus, the main body casing of the crystal resonator 1 is made up of the lid and the base 3.

Next, the crystal resonator plate 2 will be described. The crystal resonator plate 2 is disposed in the internal space 11 of the main body casing, which is made up of the base 3 and the lid, of the crystal resonator 1.

The crystal resonator plate 2 is a crystal plate shaped from a crystal wafer (not shown) made of a crystal Z plate (blank) that is an anisotropic material having a crystal orientation. The outline of a substrate 4 of the crystal resonator plate 2 is shaped in a lump (integrally) using a photolithography technique (photolithography method), for example, by wet etching using a resist or a metal film as a mask.

As shown in FIGS. 1 and 2, the substrate 4 (blank) of the crystal resonator plate 2 has an outline including: a pair of leg portions 51 and 52 (a first leg portion 51 and a second leg portion 52) serving as vibrating portions; and a base portion 6 that includes one end surface 62 from which the leg portions 51 and 52 protrude.

The base portion 6 has, as shown in FIG. 1, a bilaterally symmetrical shape in plan view, and is formed wider than the first leg portion 51 and the second leg portion 52. As shown in FIGS. 1 and 2, two conductive bumps 61 ("bumps") in the present invention) are formed by electroplating on the base portion 6 so as to be connected to the electrode pads 35 of the base 3. The conductive bumps 61 are provided respectively in the vicinity of both ends of a second main surface 42 of the base portion 6.

As shown in FIGS. 1 and 2, the pair of leg portions 51 and 52 protrudes from the one end surface 62 of the base portion 6 and is arranged in parallel with each other with a gap portion 7 interposed therebetween. Here, the gap portion 7 is disposed in the middle position (middle region) of the one end surface 62 in the width direction.

Next, the two leg portions 51 and 52 (the first leg portion 51 and the second leg portion 52) will be described with reference to the drawings (FIGS. 1 and 2).

On the two leg portions 51 and 52, respective tip portions 9 are formed wider than the other portions. Both end portions 92 of each tip surface 91 of the corresponding tip portion 9 are formed by chamfering (tapered). In both main surfaces 41 and 42, respective grooves 53 are formed so as to extend in the direction in which the leg portions 51 and 52 protrude (in the Y-axis direction shown in FIG. 1), thus the CI value is improved, which is deteriorated according to the size reduction of the crystal resonator plate 2. Here, the groove 53 in the first main surface 41 and the groove 53 in the second main surface 42 are respectively formed so as to be deviated relative to the center of each leg portion 51 and 52 in the width direction.

Figure 3:
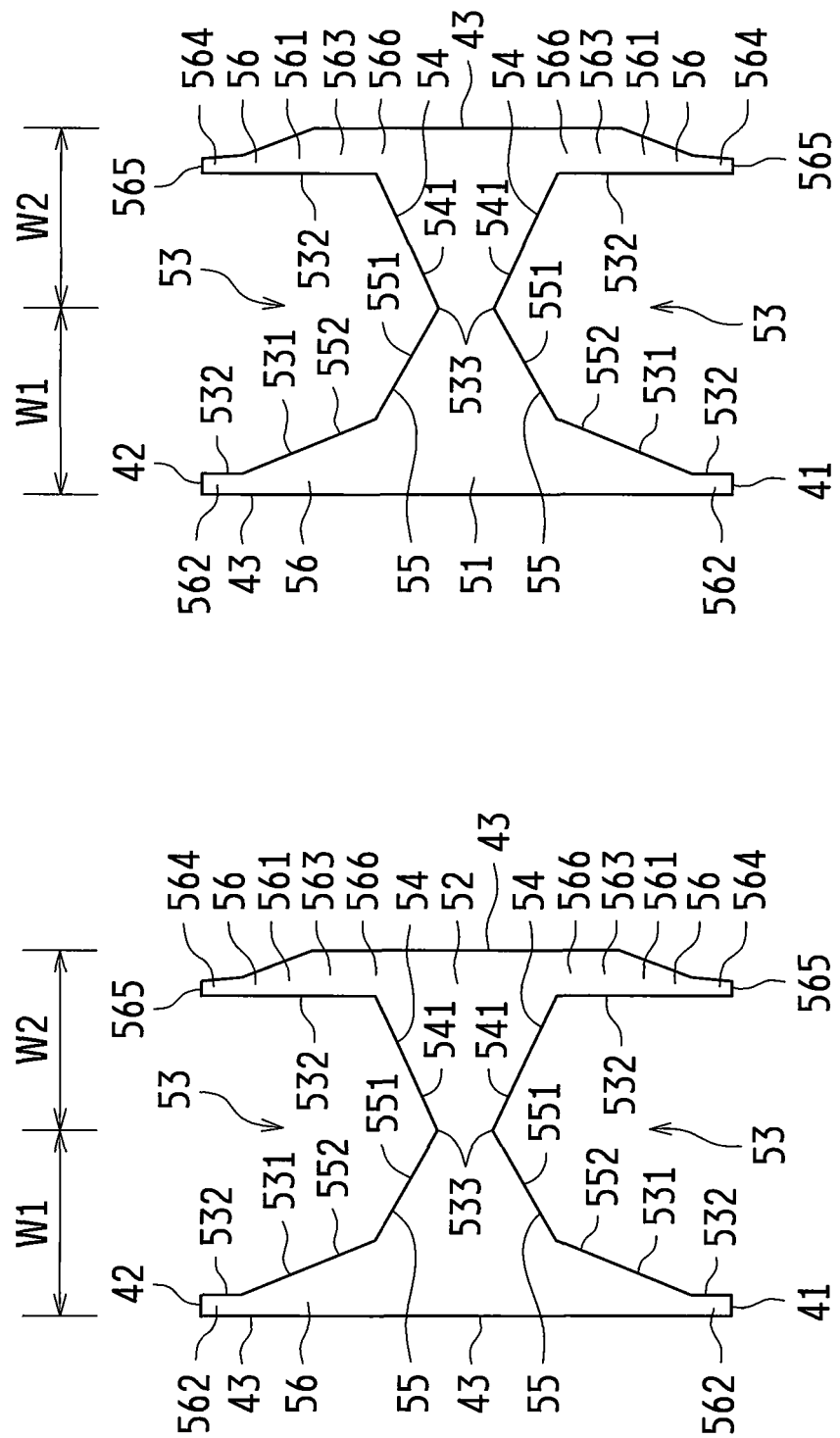
FIG. 3 is a cross-sectional view taken from line A-A of a blank of the crystal resonator plate shown in FIG. 2.

As shown in FIGS. 1 to 3, the groove 53 in the first main surface 41 of the first leg portion 51 and the groove 53 in the second main surface 42 of the first leg portion 51 are each shaped in a concave shape by wet etching. Internal surface 531 is made up of a plurality of surfaces (side surfaces 532 and the like) as shown in FIG. 3.

As shown in FIG. 3, respective lowermost points 533 of the groove 53 in the first main surface 41 and of the groove 53 in the second main surface 42 face each other. The groove 53 in the first main surface 41 and the groove 53 in the second main surface 42 are axisymmetric in cross-sectional view (cross-sectional view taken from line A-A in FIG. 2) in the longitudinal direction (the protruding direction) of the first leg portion 51 as shown in FIGS. 1 and 2.

As shown in FIG. 3, the shape in cross-sectional view of each of the first leg portion 51 and the second leg portion 52 in the width direction (in the X-axis direction shown in FIGS. 1 and 2) is substantially an H-shape. As shown in FIGS. 1 and 2, in the main surface 41 in plan view and the main surface 42 in rear view of the crystal resonator plate 2, the respective grooves 53 are formed, on each of the first leg portion 51 and the second leg portion 52, so as to be deviated relative to the center of each of the first leg portion 51 and the second leg portion 52 in the width direction (the X-axis direction). Here, the "deviated" state is satisfied when the groove 53 is formed in each of the main surface 41 and 42 so as to be deviated relative to the center of the corresponding first leg portion 51/second leg portion 52 in the width direction (the X-axis direction).

Also, in the groove 53, the internal surface 531 is formed from a first surface 54 (the side surface 532 and a first inclined surface 541) and a second surface 55 (the side surface 532, a second inclined surface 551 and a third inclined surface 552) with the lowermost point 533 being interposed therebetween in the width direction (the X-axis direction) of each of the first leg portion 51 and the second leg portion 52, as shown in FIG. 3. The ratio R of the width of the second surface 55 in the width direction to the width of the first surface 54 in the width direction satisfies the inequality 1≤R≤1.3. That is, the width of the first surface 54 in the width direction is the same (including substantially the same) as the width of the second surface 55 in the width direction. Here, the value R=1.3 indicates, for example, the upperlimit of the dimension error caused by a manufacturing error and the like. In the case of 1.3<R (e.g., R=1.35, 1.56, 1.86, 2.33 and the like), the problem cannot be solved. In this embodiment, the ratio between the width of the first surface 54 in the width direction and the width of the second surface 55 in the width direction is 50:50 to 47:53, and the specific widths of the first surface 54 and the second surface 55 are respectively, for example, 19.7 µm and 22.3 µm. Thus, in the first leg portion 51 and the second leg portion 52 according to this embodiment, the width W1 and the width W2, which are the widths from the lowermost point 533 of the groove 53 to the respective side surfaces, are the same in cross-sectional view in the X direction as shown in FIG. 3.

The two leg portions 51 and 52 include: a first driving electrode 81 and a second driving electrode 82 having different potentials from each other; and extraction electrodes 83 and 84 drawn from the first driving electrode 81 and the second driving electrode 82 so as to electrically connect the first driving electrode 81 and the second driving electrode 82 to the electrode pads 35 of the base 3. The extraction electrodes 83 and 84 are located on the base portion 6 and on the respective tip sides of the two leg portions 51 and 52 compared with the first driving electrode 81 and the second driving electrode 82.

The first driving electrode 81 is formed on the main surfaces 41 and 42 of the first leg portion 51 and both side surfaces 43 of the second leg portion 52 so as to be conducted by the extraction electrode 83. Likewise, the second driving electrode 82 is formed on the main surfaces 41 and 42 of the second leg portion 52 and both side surfaces 43 of the first leg portion 51 so as to be conducted by the extraction electrode 84.

The first driving electrode 81 and the second driving electrode 82 are partially formed inside the groove 53 (i.e. on the internal surface 531). For this reason, even when the crystal resonator plate 2 is miniaturized, vibration loss in the first leg portion 51 and the second leg portion 52 is suppressed, thus the CI value can be reduced to a low level.

Compared with the conventional crystal resonator plate, in the crystal resonator plate 2 according to this embodiment, the groove 53 in the first main surface 41 and the groove 53 in the second main surface 42 are formed so as to be deviated relative to the center of the corresponding leg portion 51/leg portion 52 in the width direction. In such a state, the lowermost point 533 of the groove 53 in the first main surface 41 is positioned in the middle of the corresponding leg portion 51/leg portion 52 in the width direction, and the lowermost point 533 of the groove 53 in the second main surface 42 is positioned in the middle of the corresponding leg portion 51/leg portion 52 in the width direction. In the crystal resonator plate 2 according to this embodiment, the length of the lowermost point 533 is increased compared with the conventional crystal resonator plate, and the number of the side surfaces 532 is decreased.

In the crystal resonator plate 2 for which a crystal plate is used according to this embodiment, in the internal surface 531 of each of the grooves 53 formed on both main surfaces 41 and 42 of each of the first leg portion 51 and the second leg portion 52, not all side surfaces 532 can be formed so as to be perpendicular to the first main surface 41 (or the second main surface 42). However, such a configuration also can be effective to maintain a weight balance of each of the first leg portion 51 and the second leg portion 52 by forming the grooves 53 so as to be deviated relative to the respective centers of the first leg portion 51 and the second leg portion 52 in the width direction (the X-axis direction).

For example, in the configuration in which the sizes of the multiple surfaces constituting the groove 53 are different from one another, the lowermost point 533 is not likely to be positioned in the center of the corresponding leg portion 51/leg portion 52, accordingly, the leg portions 51 and 52 are badly balanced in weight. Thus, the groove 53 is formed so as to be deviated relative to the center of the corresponding leg portion 51/leg portion 52 in the width direction so as to improve the weight balance. That is, in the leg portions 51 and 52, the difference between the left and right cross-sectional areas in cross-sectional view in the width direction can be reduced, which results in improvement of the weight balance (for example, see FIG. 9(B) of Japanese Patent No. 4001029).

However, only forming the grooves 53 so as to be deviated relative to the respective centers of the first leg portion 51 and the second leg portion 52 in the width direction (the X-axis direction) cannot be the optimal means to maintain the weight balance of each of the first leg portion 51 and the second leg portion 52. That is, even if the grooves 53 are formed so as to be maximally deviated relative to the respective centers of the first leg portion 51 and the second leg portion 52 in the width direction (the X-axis direction), the weight of each of the first leg portion 51 and the second leg portion 52 cannot be uniformed to the extent that the weight balance is maintained. This relates specifically to the current tendency of the crystal resonator plate 2 to be miniaturized. The conventional large-size tuning-fork type crystal resonator plate can maintain the balance without consideration of the weight balance. However, in the miniaturized crystal resonator plate 2, the first leg portion 51 and the second leg portion 52 are also miniaturized and narrowed, and the weight balance is lost when the grooves 53 are formed in the miniaturized/narrowed first leg portion 51 and the second leg portion 52. Thus, the problem that was unthinkable with respect to the conventional tuning-fork type crystal resonator plate is accompanied by the miniaturization.

In contrast, this embodiment has characteristics that the groove 53 is formed so as to be deviated relative to the center of the first leg portion 51/second leg portion 52 in the width direction (the X-axis direction), and that the width W1 and the width W2, which are the widths from the lowermost point 533 of the groove 53 to both side surfaces of the leg portion, are the same in cross-sectional view in the width direction (the X-axis direction). In this embodiment, since the width W1 and the width W2 from the lowermost point 533 of the groove 53 to the respective side surfaces of the leg portion are the same, further weight correction can be performed to the configuration using a crystal plate, in which the grooves 53 are formed so as to be deviated relative to the respective centers of the first leg portion 51 and the second leg portion 52 in the width direction (the X-axis direction), so that the weight balance can be maintained. This relates to the fact that a crystal plate is used for the crystal resonator plate 2. The side surfaces 532 composed of the multiple surfaces of the groove 53 include inclined surfaces. The inclined surfaces of the side surfaces 532 (the multiple surfaces) have different angles of inclination (or different widths). Therefore, by forming the grooves 53, the leg portions (the first leg portion 51 and the second leg portion 52) lose the weight balance. However, in this embodiment, the width W1 and the width W2 from the lowermost point 533 of the groove 53 to the respective side surfaces of the leg portion are the same in cross-sectional view in the width direction (the X-axis direction) of the corresponding first leg portion 51/second leg portion 52. Thus, it is possible to prevent the leg portions (the first leg portion 51 and the second leg portion 52) from losing the balance in weight.

Specifically, in this embodiment using the crystal plate, the grooves 53 are formed in the first leg portion 51 and the second leg portion 52 so as to be deviated relative to the respective centers of the first leg portion 51 and the second leg portion 52 in the width direction (the X-axis direction), and the width W1 and the width W2 from the lowermost point 533 of the groove 53 to the respective side surfaces of the leg portion are the same in cross-sectional view in the width direction (the X-axis direction) as shown in FIG. 3. Thus, it is possible to prevent the first leg portion 51 and the second leg portion 52 from losing the balance in weight.

The position of the groove 53 is deviated relative to the center of the corresponding first leg portion 51/second leg portion 52 in the width direction (the X-axis direction), so that the left and right weight balance of the first leg portion 51 and the second leg portion 52 in the width direction (the X-axis direction) can be maintained. Furthermore, since the width W1 and the width W2 from the lowermost point 533 of the groove 53 to the respective side surfaces of the leg portion are the same in cross-sectional view in the width direction (the X-axis direction) of the first leg portion 51/second leg portion 52, it is possible to reduce the differences in the areas of the inclined surfaces of the side surfaces 532 (the multiple surfaces).

In the result, a good weight balance is maintained. On the other hand, in the conventional tuning-fork type crystal resonator plate, the areas of the left and right inclined surfaces in the leg portion considerably differ from each other, thus, the thicknesses of the left and right sides of the leg portion having the groove therebetween differ from each other. This results in the vibrations having different frequencies of the left and right sides of the leg portion, which deteriorating the weight balance.

Also, in a case in which the groove has a bottom surface differently from this embodiment, the position of the lowermost point cannot be determined, which deteriorates the weight balance. In this embodiment, such a problem does not occur. In this embodiment, the groove has no bottom surface, but has only the lowermost point 533.

Furthermore, in the conventional tuning-fork type crystal resonator plate that has the grooves in the respective leg portions, not only the main vibration for the excitation but also other vibration modes (longitudinal vibration mode and the like) are generated. This relates to the fact that, in the conventional configuration, the lowermost point or the bottom surface of the groove is formed so as to be significantly deviated relative to the center of the leg portion in the width direction, and that the internal surface of the groove is a surface inclined relative to the main surface.

In contrast, in this embodiment, the grooves 53 are formed in the first leg portion 51 and the second leg portion 52 so as to be deviated relative to the respective centers of the first leg portion 51 and the second leg portion 52 in the width direction (the X-axis direction), and the width W1 and the width W2 from the lowermost point 533 of the groove 53 to the respective side surfaces of the leg portion are the same in cross-sectional view in the width direction (the X-axis direction) of the first leg portion 51/second leg portion 52. Thus, in cross-sectional view in the width direction (the X-axis direction) of the first leg portion 51/second leg portion 52, the shapes of the side surfaces 532 out of the internal surface 531 of the groove 53 can be substantially symmetrical. Also, compared with the conventional tuning-fork type crystal resonator plate, one or more inclined surfaces out of the internal surface of the groove 53 can be decreased. That is, by decreasing one or more surfaces out of the internal surface of the groove 53, the component ratio (areas) of the other inclined surfaces can be varied, and furthermore, the lowermost point 533 of the groove 53 can be positioned in the middle of the leg portion 51/leg portion 52.

In the result, it is possible to suppress generation of the other vibration modes (longitudinal vibration mode and the like) that would be caused by the decreased inclined surfaces.

These days, there is a tendency of miniaturization of the size of the package for the crystal resonator device, such as the crystal resonator 1 and an oscillator (not shown), on which the crystal resonator plate 2 is mounted (e.g., the package size: not more than 2.0 mm×1.2 mm, and the overall length of the crystal resonator plate 2, which is the length in the longitudinal direction corresponding to the protruding direction of the first leg portion 51 and the second leg portion 52: not more than 1.5 mm). The inventor has confirmed that, according to the miniaturization, spurious is easily generated in the vibration of the crystal resonator plate 2. On the other hand, conventionally, the spurious has hardly been generated in the crystal resonator plate 2, and there has been no need to consider spurious suppression. However, in the actual miniaturized crystal resonator plate 2, it is necessary to consider the spurious suppression. With regard to the spurious occurrence, it is possible to suppress the spurious in this embodiment, by decreasing the inclined surfaces of the side surfaces 532 of the groove 53, and reducing the differences in the angles of inclination among the inclined surfaces. Thus, due to the spurious suppression, the CI value can be reduced. This embodiment is optimal for the miniaturized crystal resonator plate 2. Furthermore, it is possible to prevent the value of oscillation frequency (the value of the main vibration) from being changed due to the spurious occurrence.

Also, the respective lowermost points 533 of the groove 53 in the first main surface 41 and of the groove 53 in the second main surface 42 are opposed to each other in cross-sectional view in the protruding direction. Thus, it is possible to prevent the weight balance from being deteriorated in the thickness direction of each of the first leg portion 51 and the second leg portion 52. In the result, it is possible to suppress the generation of other vibration modes (longitudinal vibration mode and the like) due to deterioration of the weight balance. Thus, it is possible to prevent the characteristics of the crystal resonator plate 2 from degrading, specifically, it is possible to decrease the CI value, or to suppress the increase of the CI value.

As described above, when the grooves 53 are formed in the leg portions 51 and 52, bank portions 56 are formed on the leg portions 51 and 52. That is, in the leg portions 51 and 52, the grooves 53 and the bank portions 56 are simultaneously formed.

The bank portion 56 is constituted by: a first bank portion 561 whose width is changed in the thickness direction; and a second bank portion 562 whose width is not substantially changed in the thickness direction. The first bank portion 561 and the second bank portion 562 have the side surfaces 532 of the groove 53 and the side surfaces of the corresponding leg portions 51/leg portion 52.

On each main surface (the first main surface 41 and the second main surface 42) of the first leg portion 51 and the second leg portion 52, the first bank portion 561 has a short distance (a small width) from the groove 53 (the side surface 532 of the groove 53) to the corresponding side surface 43 of the leg portion (the first leg portion 51 and the second leg portion 52) compared with the second bank portion 562.

The first bank portion 561 is constituted by a thick portion 563 having a large width and a thin portion 564 having a small width. In this embodiment, the width of the bank portion 56 varies along the thickness direction of the leg portion 51/leg portion 52. That is, its width is small on the side of a tip portion 565 of the bank portion 56 disposed on the side of the main surface 41/main surface 42 of the leg portion 51/leg portion 52, and is large on the side of a base end portion 566 of the bank portion 56 disposed in the middle in the thick direction of the leg portion 51/leg portion 52. The first bank portion 561 (specifically, the side surface 43 of the leg portion 51/leg portion 52) is tapered so that the width is gradually changed from the thick portion 563 to the thin portion 564. For this reason, in the first bank portion 561, when the tapered portion is included in the thick portion 563, the cross section of the thick portion 563 of the first bank portion 561 in FIG. 3 has a trapezoidal shape. The side surface 43 of the leg portion 51/leg portion 52 corresponding to the upper surface (top surface) of the trapezoid is opposed to the side surface 532 of the groove 53 corresponding to the lower surface via the first bank portion 561. The above tapered portions are respectively formed on the side surfaces 532 of the leg portions 51 and 52. In the thin portion 564, the side surface 43 of the leg portion 51/leg portion 52 is opposed to the side surface 532 of the groove 53 via the first bank portion 561.

The side surface 43 of the second bank portion 562 of the leg portions 51/leg portion 52 is not substantially tapered but formed so as to have a planar surface. The side surface 43 of the second bank portion 562 of the leg portions 51/leg portion 52 is parallel to the top surface of the trapezoid of the thick portion 563 of the first bank portion 561.

As described above, in the first leg portion 51 and the second leg portion 52 according to this embodiment, the width W1 and the width W2 from the lowermost point 533 of the groove 53 to the respective side surfaces are the same, and the lowermost point 533 of the groove 53 is positioned in the middle of the corresponding leg portion 51/leg portion 52, in cross-sectional view in the X-axis direction shown in FIG. 3. This relates to the fact that: the groove 53 is formed so as to be deviated relative to the center of the corresponding first leg portion 51/second leg portion 52 in the width direction (the X-axis direction) so that the width (length in the width direction) of second bank portion 562 is wider (longer) than the width of the first bank portion 561; and the first bank portion 561 is constituted by the thick portion 563 and the thin portion 564, the thick portion 563 being located in the width direction where the lowermost point 533 of the groove 53 is positioned. Thus, the width W1 and the width W2 from the lowermost point 533 of the groove 53 to the respective side surfaces are the same.

Also, in this embodiment, on the at least one main surface (the second main surface 42 in this embodiment) of each of the two leg portions 51 and 52, the metal film 93 is formed by electroplating on the tip portion 9, which is on the tip side compared with the position where the extraction electrode 83 or 84 is formed (i.e., the position related to the excitation). The metal film 93 is not conducted to the first driving electrode 81, the second driving electrode 82 and the extraction electrodes 83 and 84. On the at least one main surface (the second main surface 42 in this embodiment) of each of the two leg portions 51 and 52, the substrate 4 surrounding the metal film 93 is exposed.

On the further tip side of the tip portion 9 relative to the metal film 93, the tip portion metal film 96 for precise adjustment of the oscillatory frequency is formed by electroplating. The tip portion metal film 96 is formed on each chamfered portion (each end portion 92 of the tip surface 91), and on each of the main surfaces 41 and 42 of the tip portion 9. The tip portion metal film 96 is conducted to the first driving electrode 81, the second driving electrode 82 and the extraction electrodes 83 and 84, and not conducted to the metal film 93.

In the crystal resonator plate 2 having the above-described configuration, a crystal wafer (not shown) made of a crystal Z plate is used, which is an anisotropic material having a crystal orientation. The outline of the substrate 4 of the crystal resonator plate 2 is shaped using the photolithography technique (the photolithography method), for example, by wet etching using a resist as a mask.

After the blank of the substrate 4 is formed, the first driving electrode 81, the second driving electrode 82, the extraction electrodes 83 and 84, the metal films 93 and the tip portion metal films 96 are formed by electroplating (metal film forming process) using the photolithography method, for example, by wet etching using a resist as a mask.

In the metal film forming process, the metal film 93 is formed, on at least one main surface (the second main surface 42) of the tip portion 9 of each of the two leg portions 51 and 52, as a metal island film 93 whose periphery (a peripheral portion 94) is the blank of the substrate 4 so that the metal film 93 is not conducted to the first driving electrode 81, the second driving electrode 82, the extraction electrodes 83 and 84 and the tip portion metal film 96.

After the metal film forming process, the conductive bumps 61 are formed by electroplating so as to be electrically connected to the outside.

Then, the tip portion metal films are removed, as necessary, by partially irradiating with ion beam, and the oscillatory frequency is precisely adjusted. Thus, the frequency adjustment of the crystal resonator plate 2 is completed.

Figure 4:
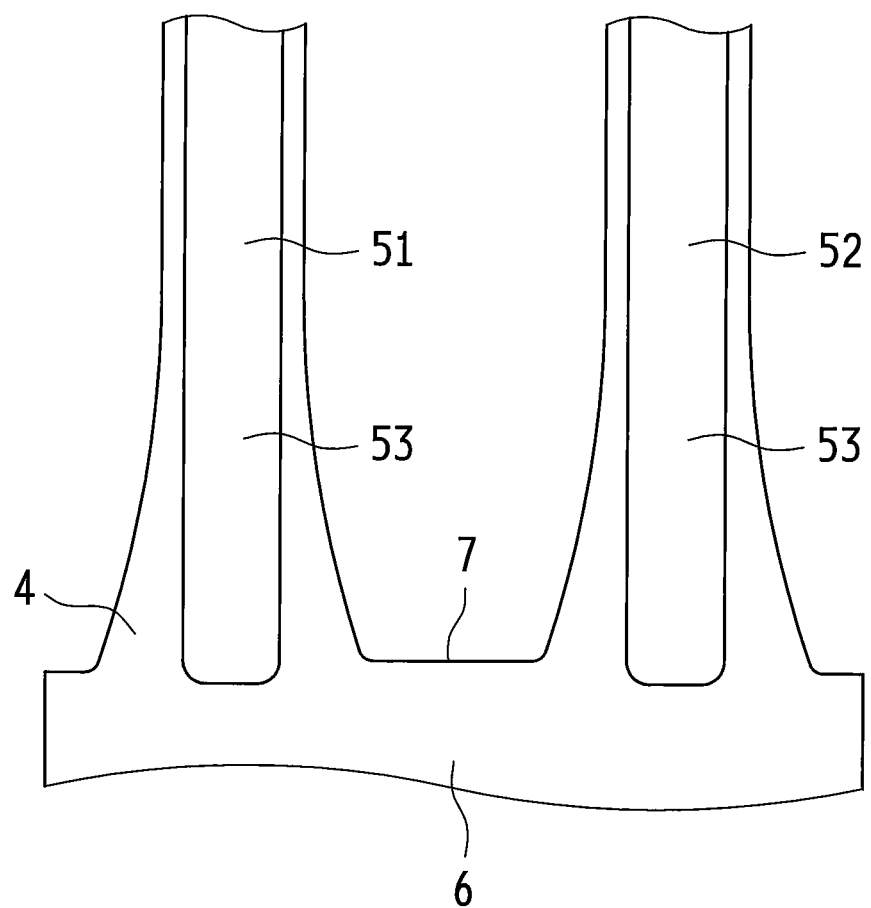
FIG. 4 is a partially enlarged schematic plan view of the blank of the crystal resonator plate shown in FIG. 2, showing a part (a base end side of a leg portions) of the blank of the crystal resonator plate.
Figure 5:
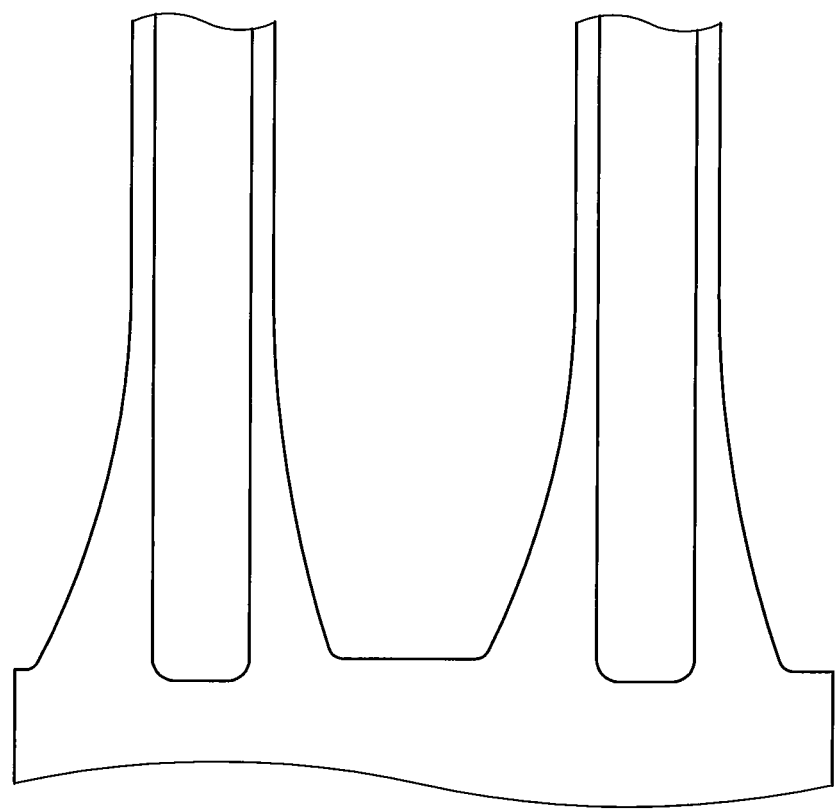
FIG. 5 is a partially enlarged schematic plan view of a blank of a conventional crystal resonator plate corresponding to the blank of the crystal resonator plate in FIG. 4.

The blank (the substrate 4) of the crystal resonator plate 2 having the above-described configuration, which is manufactured by the above-described process, is shaped as shown in FIGS. 3 and 4. As it can be seen from FIGS. 3 and 4, in the crystal resonator plate 2 according to this embodiment, the blank on the side of the base portion 6 of each of the leg portions 51 and 52 of the crystal resonator plate 2 has a bilaterally symmetric, well balanced shape.

With the crystal resonator plate 2 and the crystal resonator 1 according to this embodiment, the crystal resonator plate 2 having the leg portions 51 and 52 in which the grooves 53 are formed can oscillate stably even when the width of the grooves 53 is increased relative to the width of the leg portions 51 and 52. Specifically, since the first bank portion 561 is constituted by the thick portion 563 and the thin portion 564, it is possible to substantially increase the width of the first bank portion 561. Thus, a stable oscillation can be obtained by suppressing the generation of the other vibration modes (generation of spurious). With the conventional tuning-fork type crystal resonator plate, it is possible to decrease the CI value by increasing the width of the grooves, while the planar shape of the side surfaces of the leg portion leads to the width of the bank portions being generally decreased. Thus, the rigidity is decreased. For this reason, in the conventional tuning-fork type crystal resonator plate, it is difficult to ensure the width of the bank portions necessary for the vibration while decreasing the CI value by increasing the width of the grooves. In contrast, with the crystal resonator plate 2 and the crystal resonator 1 according to this embodiment, it is possible to decrease the CI value by increasing the width of the grooves 53 while ensuring the width of the bank portions 56 necessary for the vibration.

In the crystal resonator plate 2 and the crystal resonator 1 according to this embodiment, the first bank portion 561 is constituted by the thick portion 563 and the thin portion 564. Due to the thick portion 563, it is possible to reduce the size of the crystal resonator plate 2 while increasing the rigidity. In the result, it is possible to obtain a stable oscillation and suppress the increase of the oscillatory frequency. Furthermore, due to the thin portion 564, it is possible to reduce the size of the crystal resonator plate 2 while decreasing the CI value. Thus, by constituting the first bank portion 561 by the thick portion 563 and the thin portion 564, it is possible to maintain the rigidity by the thick portion 563 while increasing the width of the groove 53 relative to the width of the corresponding leg portion 51/leg portion 52. Accordingly, it is possible to realize the miniaturized crystal resonator plate 2 in which the CI value is decreased while suppressing the oscillatory frequency.

Although the groove 53 is formed so as to be deviated relative to the center of the corresponding leg portion 51/leg portion 52 in the width direction, the respective widths from the lowermost point 533 of the groove 53 to both side surfaces 43 of the respective leg portions 51 and 52 are the same. Thus, due to the thick portion 563, the weights of the left and right sides of the groove 53 in cross-sectional view in the width direction are well balanced. Accordingly, the vibration can be stabilized.

The cross section of the thick portion 563 has a trapezoidal shape, and the thick portion 563 is located in the width direction where the lowermost point 533 of the groove 53 is positioned. Thus, it is possible to face the driving electrode 82 formed in the groove 53 and the driving electrode 81 disposed on both side surfaces 43 via the first bank portion 561. In the result, the vibration efficiency is improved and the CI value is decreased.

Since the top surface of the trapezoid of the thick portion 563 is disposed so as to face the surface of the groove 53, it is possible to form parallel electrodes by a pair of electrodes, i.e., the first driving electrode 81 and the second driving electrode 82. Thus, it is possible to obtain perfect charge efficiency. In particular, due to the thick portion 563 having the trapezoidal shape, part of the first bank portion 561 can have the fixed thickness relative to the bending direction. Thus, it is possible to suppress the generation of the other vibration modes (longitudinal vibration mode and the like) and decrease the CI value.

On the further tip side of the tip portion 9 relative to the metal film 93, the tip portion metal film 96 for precise adjustment of the oscillatory frequency is formed, and the tip portion metal film 96 and the metal film 93 are not conducted to each other. Thus, after the frequency adjustment by the formation of the recess portion 95, it is possible to precisely adjust, separately, the oscillatory frequency. Also, the tip portion metal film 96, which is formed on the further tip side of the tip portion 9 relative to the metal film 93, can protect the tip portion 9 against physical shock (for example, contact of the crystal resonator plate 2 with the base 3 on which the crystal resonator plate 2 is mounted).

In this embodiment, the respective grooves 53 are formed in the main surfaces 41 and 42 of the leg portions 51 and 52. However, the present invention is not limited thereto. The groove 53 may be formed in either the main surface 41 or 42 of the respective leg portions 51 and 52. In this case also, an advantageous effect according to this embodiment can be obtained. However, it is preferable that the grooves 53 are respectively formed on the main surfaces 41 and 42.

In this embodiment, the metal film 93 is formed on the second main surface 42 of the tip portion 9 of each of the two leg portions 51 and 52. However, the present invention is not limited thereto. The metal film 93 may be formed on each of the main surfaces 41 and 42 of the tip portion 9 of the leg portions 51 and 52.

Figure 6:
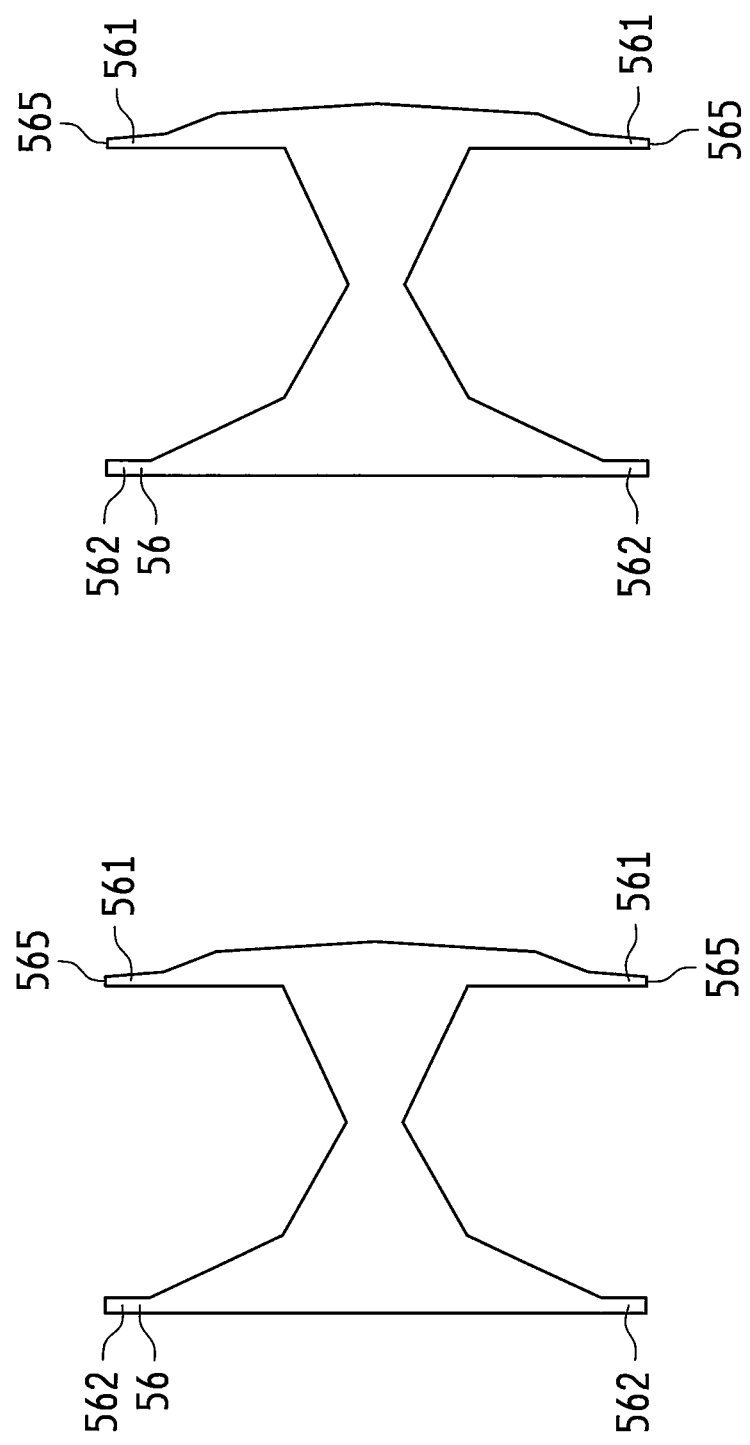
FIG. 6 is a cross-sectional view of a blank of a crystal resonator plate according to another aspect of the embodiment, corresponding to FIG. 3.

The width of the bank portion 56 is not limited to this embodiment shown in FIG. 3. For example, as shown in FIG. 6, the width of the tip portion 565 of the bank portion 56 may further be decreased compared with the state shown in FIG. 3. In the bank portion 56 shown in FIG. 6, the widths of the tip portions 565 of the first bank portion 561 and the second bank portion 562 are decreased, however, the present invention is not limited thereto. At least the width of the tip portion 565 of the first bank portion 561 having the thick portion 563 and the thin portion 564 may be decreased.

In this embodiment, as shown in FIG. 3, the side surface 43 of the thick portion 563 (except the tapered portion) of the first bank portion 561 is planar surface. However, it may have a convex shape toward the outside as shown in FIG. 6.

The present invention can be embodied and practiced in other different forms without departing from the spirit and essential characteristics of the present invention. Therefore, the above-described embodiments are considered in all respects as illustrative and not restrictive. The scope of the invention is indicated by the appended claims rather than by the foregoing description. All variations and modifications falling within the equivalency range of the appended claims are intended to be embraced therein.

This application claims priority based on Patent Application No. 2013-083066 filed in Japan on Apr. 11, 2013. The entire contents thereof are hereby incorporated in this application by reference.

INDUSTRIAL APPLICABILITY

The present invention is suitable for a tuning-fork type crystal resonator plate having leg portions on which grooves are mounted, especially suitable for the tuning-fork type crystal resonator plate reduced in size.

DESCRIPTION OF REFERENCE NUMERALS

1 Tuning-fork type crystal resonator
11 Internal space
2 Tuning-fork type crystal resonator plate
3 Base
31 Bottom portion
32 Dike portion
33 Step portion
34 Metallization layer
35 Electrode pad
4 Substrate
41, 42 Main surfaces (first main surface 41 and second main surface 42)
43 Side surface
51, 52 Leg portions (first leg portion 51 and second leg portion 52)
53 Groove
531 Internal surface
532 Side surface
533 Lowermost point
54 First surface
541 First inclined surface
55 Second surface
551 Second inclined surface
552 Third inclined surface
56 Bank portion
561 First bank portion
562 Second bank portion
563 Thick portion
564 Thin portion
565 Tip portion
566 Base end portion
6 Base portion
61 Conductive bump
62 One end surface
7 Gap portion
81 First driving electrode
82 Second driving electrode
83, 84 Extraction electrodes
9 Tip portion
91 Tip surface
92 End portions of tip surface
93 Metal film
94 Peripheral portion
95 Recess portion
96 Tip portion metal film

The invention claimed is:

1. A tuning-fork type crystal resonator plate, comprising:
a base portion; and a pair of leg portions protruding from the base portion in one direction,
wherein a groove and a bank portion are formed on at least one of main surfaces of each of the leg portions,
wherein the bank portion is formed accompanied by the formation of the groove
wherein a width of the bank portion differs along a thickness direction and the bank portion is constituted by a thick portion having a large width and a thin portion having a small width,
wherein the groove is formed so as to be deviated relative to a center of the leg portion in a width direction, and
wherein widths from a lowermost point of the groove to respective side surfaces of the leg portion in cross-sectional view in the width direction are the same.

2. The tuning-fork type crystal resonator plate according to claim 1,
wherein the thick portion has a trapezoidal shape in cross-sectional view in the width direction, and
wherein the thick portion is located in the width direction where a lowermost point of the groove is positioned.

3. The tuning-fork type crystal resonator plate according to claim 2,
wherein a top surface of the trapezoid of the thick portion faces a side surface of the groove.

4. A crystal resonator device comprising the tuning-fork type crystal resonator plate according to claim 2.

5. A crystal resonator device comprising the tuning-fork type crystal resonator plate according to claim 3.

6. The tuning-fork type crystal resonator plate according to claim 1,
wherein, in the main surfaces of the leg portion, the respective grooves are formed in a first main surface and a second main surface, and
wherein the lowermost point of the groove in the first main surface and the lowermost point of the groove in the second main surface are opposed to each other in cross-sectional view in a protruding direction.

7. A crystal resonator device comprising the tuning-fork type crystal resonator plate according to claim 6.

8. A crystal resonator device comprising the tuning-fork type crystal resonator plate according to claim 1.

9. A tuning-fork type crystal resonator plate, comprising:
a base portion; and a pair of leg portions protruding from the base portion in one direction,
wherein a groove and a bank portion are formed on at least one of main surfaces of each of the leg portions,
wherein the bank portion is formed accompanied by the formation of the groove,
wherein a width of the bank portion differs along a thickness direction and the bank portion is constituted by a thick portion having a large width and a thin portion having a small width,
wherein the thick portion has a trapezoidal shape in cross-sectional view in the width direction,
wherein the thick portion is located in the width direction where a lowermost point of the groove is positioned, and
wherein a top surface of the trapezoid of the thick portion faces a side surface of the groove.

10. The tuning-fork type crystal resonator plate according to claim 9,
wherein, in the main surfaces of the leg portion, the respective grooves are formed in a first main surface and a second main surface, and
wherein the lowermost point of the groove in the first main surface and the lowermost point of the groove in the second main surface are opposed to each other in cross-sectional view in a protruding direction.

11. A crystal resonator device comprising the tuning-fork type crystal resonator plate according to claim 9.

12. A crystal resonator device comprising the tuning-fork type crystal resonator plate according to claim 10.

* * * * *